United States Patent [19]

Oda

[11] Patent Number: 4,805,026
[45] Date of Patent: Feb. 14, 1989

[54] METHOD FOR DRIVING A CCD AREA IMAGE SENSOR IN A NON-INTERLACE SCANNING AND A STRUCTURE OF THE CCD AREA IMAGE SENSOR FOR DRIVING IN THE SAME METHOD

[75] Inventor: Eiji Oda, Tokyo, Japan

[73] Assignee: NEC Corporation, Japan

[21] Appl. No.: 14,993

[22] Filed: Feb. 17, 1987

[30] Foreign Application Priority Data

Feb. 18, 1986 [JP] Japan .................................. 61-34395
Apr. 9, 1986 [JP] Japan .................................. 61-81278

[51] Int. Cl.$^4$ ............................................. H04N 3/14
[52] U.S. Cl. ............................ 358/213.29; 358/213.26
[58] Field of Search ...................... 358/213.26, 213.27, 358/213.29, 213.31, 213.22; 357/30 H

[56] References Cited

U.S. PATENT DOCUMENTS 4,652,925  3/1987  Kimata .......................... 358/213.29
4,707,744  11/1987  Kimata et al. ................. 358/213.29
4,752,829  6/1988  Kim ................................. 358/213.29

Primary Examiner—Jin F. Ng
Assistant Examiner—Stephen Brinich
Attorney, Agent, or Firm—Laff, Whitesel, Conte & Saret

[57] ABSTRACT

The invention provides a method for driving a CCD area image sensor. An interline transfer type CCD area image sensor includes a plurality of photo sensors arranged in a plurality of lines. A plurality of vertical shift registers are disposed along one of the lines of photo sensors. A horizontal shift register is formed to receive charges from the vertical shift registers. An output circuit converts the charges transferred through the horizontal shift resistor into electrical signals. The driving method includes the steps of accumulating charges in the photo sensors, transferring charges accumulated in all of the photo sensors to the vertical shift registers, and shifting the transferred charges to the horizontal shift register via the vertical shift registers. The start of charge-shiftings is initiated from the charges in the order of the distances between the transferred position and the photo sensors and the horizontal shift register. The charges received from the vertical shift registers are shifted through the horizontal shift register to an output circuit where the quality of charges reaching the output is converted into an electrical signal. The CCD area image sensor includes at least one shift register circuit for producing shift pulses which perform the above-mentioned operations.

11 Claims, 6 Drawing Sheets

METHOD FOR DRIVING A CCD AREA IMAGE SENSOR IN A NON-INTERLACE SCANNING AND A STRUCTURE OF THE CCD AREA IMAGE SENSOR FOR DRIVING IN THE SAME METHOD

BACKGROUND OF THE INVENTION

1. Field of the Invention

The invention relates to a driving method and a structure of a CCD (Charge Coupled Device) area image sensor, and more particularly to a method for driving a CCD area image sensor of an interline transfer type in a non-interlace scanning and to a structure of the same suitable for the driving in the non-interlace scanning.

2. Description of the Related Art

A CCD area image sensor has been developed with a technical progress of semiconductor integrated circuits to the extent that it can be used as a TV camera for commercial-use and home-use. Vigorous studies still continue for improvement of the CCD area image sensor. An improvement of resolution is one of technical problems. While the resolution in horizontal direction can be easily improved by increasing the number of photosensor elements, that in the vertical direction cannot be improved by the same method, because the maximum limit in number of scanning lines is fixed by the TV standard.

In recent years, an attempt for improving the resolution in vertical direction is made by driving the CCD area image sensor in a non-interlace scanning in place of a driving in a conventional interlace scanning. The visual resolution of the non-interlaced picture is theoretically improved by 66 percent, compared to the interlaced picture. The conventional CCD area image sensor of an interline transfer type, however, is designed for the interlace scanning, and cannot be driven in the non-interlacing scanning.

More specifically, the interline transfer type CCD area image sensor has a plurality of lines of photosensors, a plurality of vertical shift registers interposed between the lines of photosensors, a horizontal shift register positioning at ends of the vertical shift registers and an output means producing a voltage signal from quantity of charges transferred through the horizontal shift register. The vertical and horizontal shift registers are made of a series connection of shift stages. One shift stage comprises two sets of storage and barrier electrodes. Charges are stored under one of storage electrodes. Two photo sensors are disposed besides one shift stage of the vertical shift register. At a time, charges accumulated in one of the two photo sensors are transferred to a portion under one of storage electrodes of the corresponding shift stage. The transferred charges are then transferred through the vertical shift register to the horizontal shift register. After the charges are transferred through the horizontal shift register to the output means, the transferred charges are converted into a voltage form signal. In the next time, charges accumulated in the other of the two photo sensors are transferred to another portion under the other storage electrode of the corresponding shift stage and then transferred through the vertical and horizontal shift registers to the output means. This process performs the interlace scanning.

If charges accumulated in the adjacent two photo sensors are simultaneously transferred to the portions under both storage electrodes in one shift stage, the charges are mixed during the transfer through the vertical shift register. The charge mixing is unavoidable, so far as the vertical shift register is driven by usual shift pulses of two or four phases. Due to such charge mixing, the electrical signals corresponding to picture elements can not be obtained with high fidelity. In this way, the non-interlace scanning is impossible by the conventional driving method of the interline type CCD area image sensor.

SUMMARY OF THE INVENTION

It is a primary object of the present invention to provide a method for driving an interline transfer type CCD area image sensor in a non-interlace scanning.

It is another object of the present invention to provide a structure of an interline transfer type CCD area image sensor for being driven in a non-interlace scanning.

It is still another object of the present invention to provide a structure of an interline transfer type CCD area image sensor for being driven in both interlace and non-interlace scannings which are interchangeable.

According to a main feature of the present invention, a method for driving an interline transfer type CCD area image sensor includes a plurality of photo sensors arranged in a plurality of lines. A plurality of vertical shift registers are disposed along one of the lines of photo sensors, each of the vertical shift registers including a plurality of shift stages connected in series. Each of the photo sensors is disposed to correspond to one shift stage. A horizontal shift register is formed to receive charges from the vertical shift registers, converting charges transferred through the horizontal shift resistor into electrical signals. The charges accumulated in the photo sensors are transferred to the vertical shift register. The driving method includes the steps of accumulating charges in the photo sensors, and transferring those charges to the vertical shift registers. The transferred charges are shifted towad the horizontal shift register via the vertical shift registers so that starts of charge-shiftings are initiated in the order of distances between the horizontal shift register and the positions to which charges are transferred from the photo sensors. The shifting charges are received from the vertical shift registers via the horizontal shift register and moved toward the output means, converting the quantity of charges reaching the output into an electrical signal.

The main feature of the present invention includes the steps of delaying the shift operation in the vertical shift registers such that delay time for each stage increases as the distance from the horizontal shift register to that stage is increased. As a result, all the charges transferred from all the photo sensors to positions under every storage electrodes of the vertical shift register can be shifted through the vertical shift register without mixing with other charges. Thus, charges accumulated in all the photo sensors can be converted into electrical signal with a non-interlace scanning.

The driving of the vertical shift register can be realized by use of a shift register circuit which may include a series connection of a transfer gate and an inverter receiving the output of the transfer gate. The outputs from the inverters are sequentially applied to the storage and barrier electrodes of the vertical shift register in an order of distance from the horizontal shift register.

The driving method of the interline transfer type CCD area image sensor can be interchanged between the non-interlace scanning and the interlace scanning by modifying the shift register circuit so that four phase shift pulses are respectively applied to the input terminals of the inverters through switches. At the non-interlace driving, the switches are made open to shift a pulse applied to the first stage transfer gate through the shift register circuit. At the interlace driving, all the transfer gates are made open to apply the four phase shift pulses to the vertical shift register through the inverters.

BRIEF DESCRIPTION OF THE DRAWINGS

The above and further objects, features and advantages of the present invention will become more apparent from the following detailed description taken in conjunction with the accompanying drawings, wherein.

Figure 1:
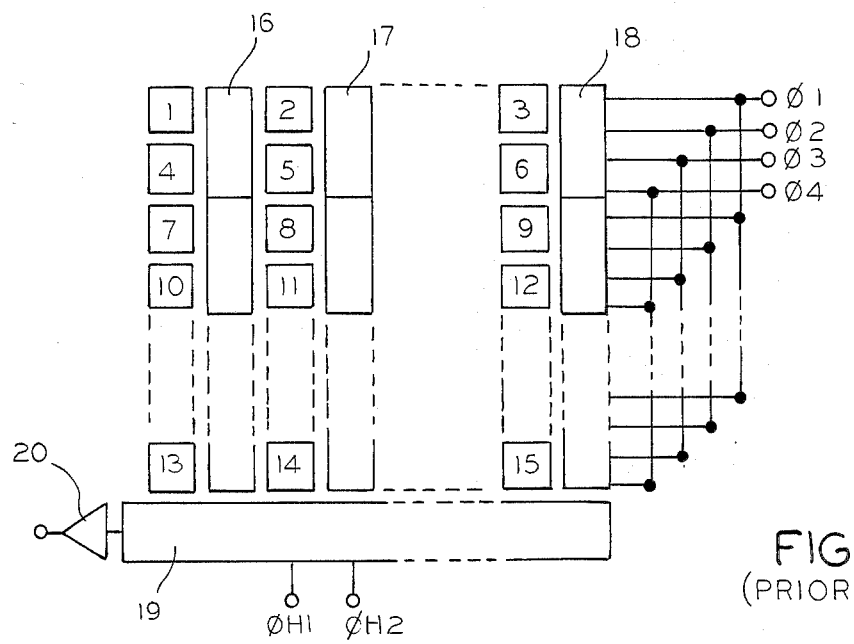
FIG. 1 is a schematic plan view of the interline transfer type CCD area image sensor in the prior art.
Figure 2:
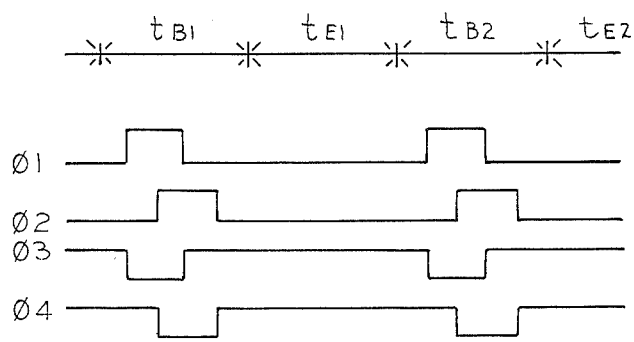
FIG. 2 is a timing chart of shift pulses applied to the vertical shift register of the CCD area image sensor in the prior art shown in FIG. 1.

The interline transfer type CCD area image sensor in the prior has a plurality of couples of a line of photo sensors 1, 4, 7, 10 . . . 13, 2, 5, 8, 11 . . . 14, . . . , 3, 6, 9, 12 . . . 15 and a vertical shift register 16, 17 . . . 18, as shown in FIG. 1. Each two photo sensors are disposed for each one shift stage of the vertical shift register. In each shift stage, a first barrier electrode receiving a shift pulse $\phi_1$, a first storage electrode receiving a shift pulse $\phi_2$, a second barrier electrode receiving a shift pulse $\phi_3$ and a second storage electrode receiving a shift pulse $\phi_4$ are arranged in this order from up to down in FIG. 1. That is, first barrier and storage electrodes oppose one photo sensor, second barrier and storage electrodes opposing another photo sensor. The storage electrodes are extended to the photo sensors, to transfer charges accumulated in the photo sensors in response to transfer pulse added to the shift pulses $\phi_2$ and $\phi_4$ in a vertical blanking period and having a hight higher than the pulses for shifting charges through the vertical shift register 16, 17 . . . 18. The pulses $\phi_1$, $\phi_2$, $\phi_3$ and $\phi_4$ for charge shifting are shown in FIG. 2.

At a time, charges accumulated in the photo sensors 1, 2, 3, 7, 8, 9 . . . are transferred to the vertical shift register 16, 17 . . . 18 and then shift therethrough toward a horizontal shift register 19. After every shift of charges by one shift stage at a horizontal blanking periods $t_{B1}$ and $t_{B2}$, charges transferred to the horizontal shift register 19 are shifted therethrough toward a charge-voltage converter 20 at horizontal field periods $t_{E1}$ and $t_{E2}$ to produce output signals of a voltage form. Thereafter, charges accumulated in the other photo sensors 4, 5, 6, 7, 8, 9 . . . 13, 14, 15 are transferred to the vertical shift registers 16, 17, 18 to be shifted therethrough to the horizontal shift register 19. The charges transferred to the horizontal shift register 19 are shifted therethrough to the charge-voltage converter 20.

Thus performed operation is the interlace scanning. According to the interlace scanning, at any time, charges do not exist at adjacent half of shift stage and can be transferred through the vertical shift registers 16, 17 and 18 without mixing with other charges. If charges accumulated in all the photo sensors, however, are simultaneously transferred to the shift registers 16, 17 and 18, charges are stored under the storage electrodes of every shift stage. In such condition, if charges are shifted through the vertical shift registers 16, 17 and 18, charges in the adjacent half of shift stage are mixed to loose the information detected by the photo sensors. This means that it is impossible to drive the interline transfer type CCD area image sensor in the non-interlace scanning so far as the conventional shift pulses are used.

DESCRIPTION OF THE PREFERRED EMBODIMENTS

Figure 3:
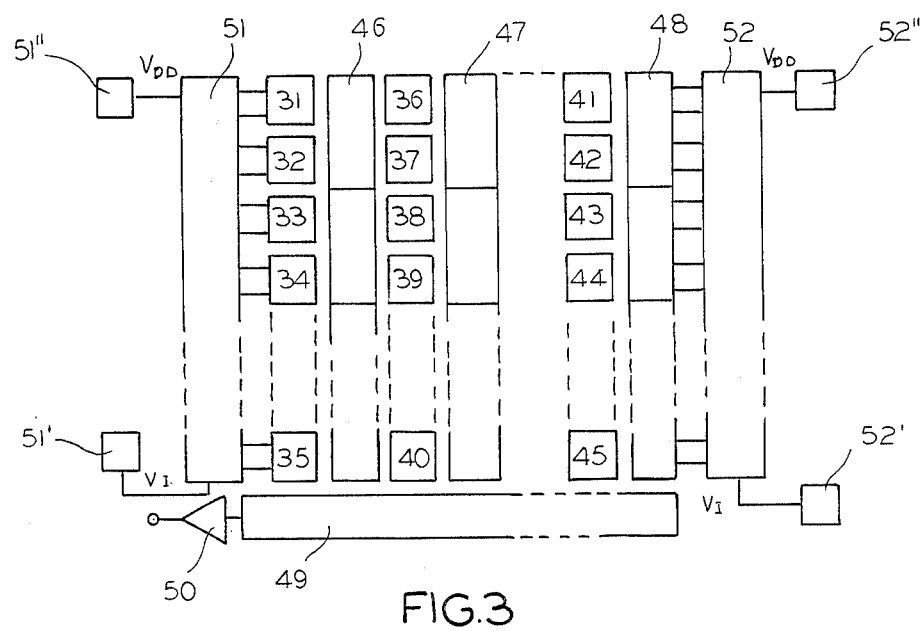
FIG. 3 is a schematic plan view of a first embodiment of the present invention.

The first embodiment uses shift registers 51 and 52 for producing shift pulses applied to vertical shift registers 46, 47 . . . 48, as shown in FIG. 3. Input pulse generators 51' and 52' produces input pulses $V_I$ and clock pulses $\phi_{11}$ and $\phi_{12}$ to be supplied to the shift registers 51 and 52. Power voltage controllers 51'' and 52'' raise voltages $V_{DD}$ at high power voltage line of the shift registers 51 and 52, when charges are transferred to the vertical shift registers 46, 47 . . . 48 from photo sensors 31, 32 . . . 45 at vertical blanking periods. The other construction of the interline transfer type CCD area image sensor is similar to the CCD area image sensor in the prior art shown in FIGS. 1 and 2. A plurality of photo sensors 31, 32 . . . 45 are arranged in a matrix. Two of the photo sensors are disposed so as to oppose one shift stage of the vertical shift registers. A line of photo sensors and one vertical shift register form a pair. A plurality of pairs are disposed in parallel. A horizontal shift register 49 is disposed at the lower ends of the pairs of the photo sensor line and a vertical shift resistor. The charges accumulated in all the photo sensors 31, 32 . . . 45 are transferred to the vertical shift registers 46, 47 . . . 48, shifted through the vertical shift registers 46, 47 . . . 48 to the horizontal shift register 49, shifted through the horizontal shift register 49 to a charge-voltage converter 59, and then converted into voltage form signals by the charge-voltage converter 59. The shift register 51 supplies shift pulses to electrodes of the vertical shift registers in the left half. The shift register 52 supplies shift pulses to electrodes of the vertical shift registers in the right half. Those two shift registers 51 and 52 may be replaced with one shift register, if wiring impedance of the vertical shift registers 46, 47 . . . 48 can be neglected. All of FIG. 3 are formed on a single chip of semiconductor substrate.

Figure 4:
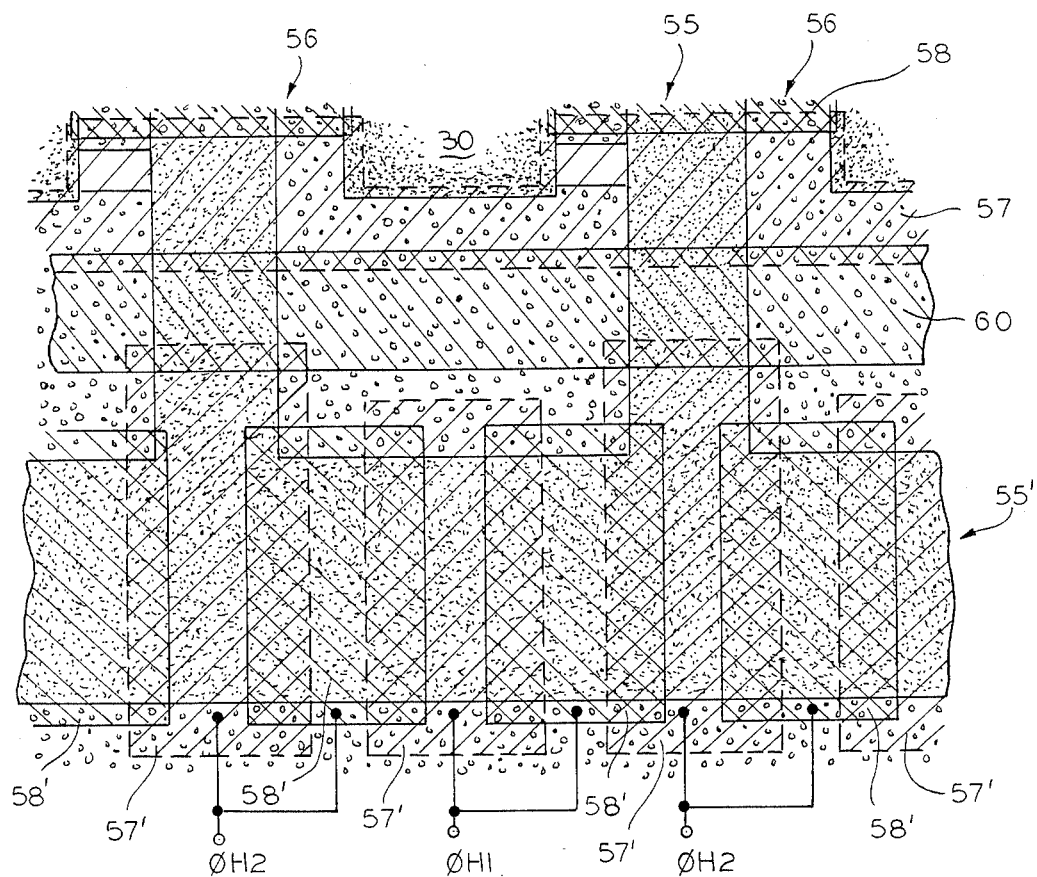
FIG. 4 is a detailed plan view of a part of a horizontal shift resistor according to the first embodiment.
Figure 5A:
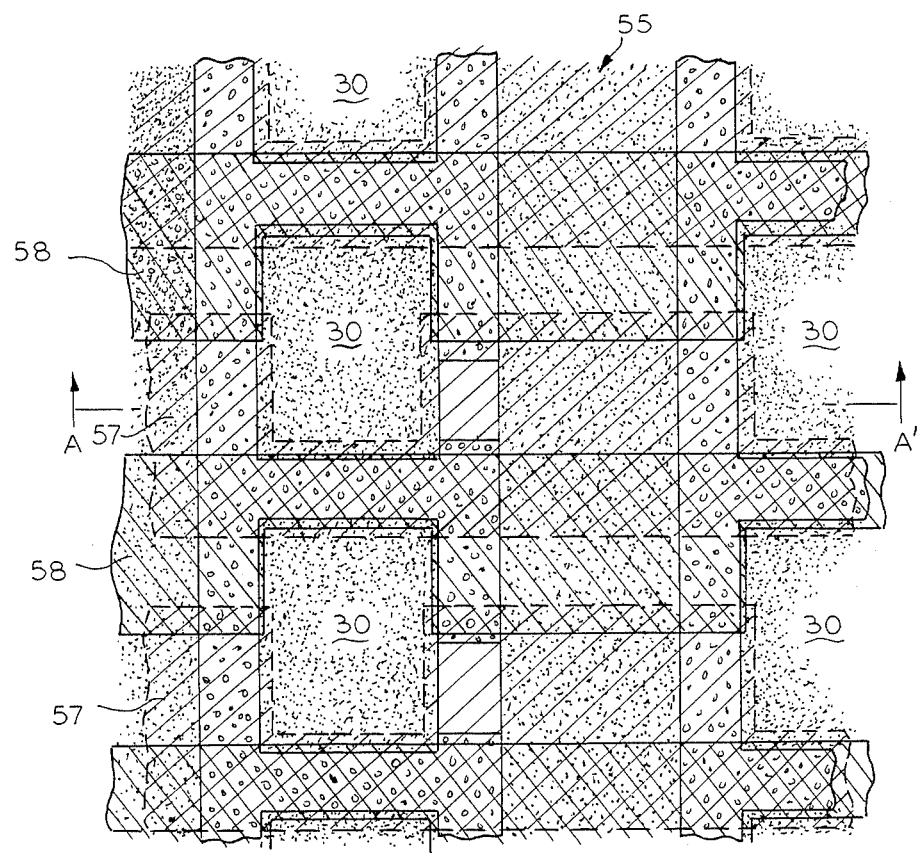
FIG. 5(a) is a detailed plan view of a part of photo sensors and vertical shift registers according to the first embodiment.
Figure 5B:
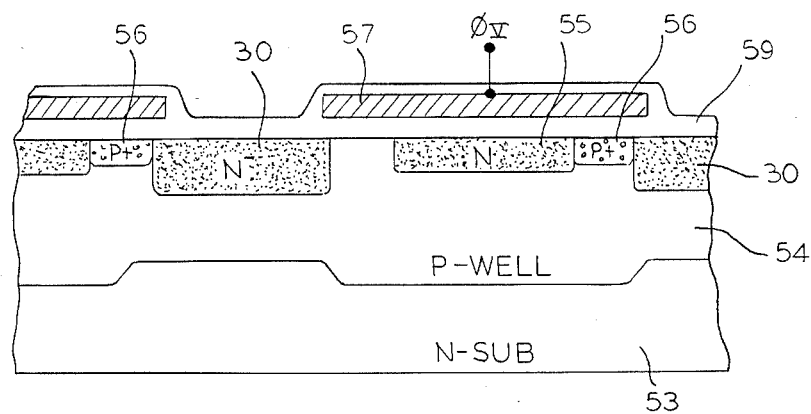
FIG. 5(b) is a sectional view taken along A-A' of FIG. 5(a)

The interline transfer type CCD area image sensor is formed on an N-type substrate 53 having an impurity concentration of $10^{14} \sim 10^{16}$ cm$^{-3}$, as shown in a sectional view of FIG. 5(b). The horizontal shift register is formed on an N-type channel region 55', as shown in FIG. 4, which is formed in a P-type well region 54

(FIG. 5(b)) having an impurity concentration of $10^{14} \sim 5 \times 10^{15}$ cm$^{-3}$ and which is formed in the N-type substrate 53. The channel region 55' is surrounded by a P-type channel stopper region 56 and is extended to channel regions 55 of vertical shift registers.

The horizontal shift register 49 used in the first embodiment is a buried type. Surface of the channel region 55' is covered with SiO$_2$ film. A first polycrystalline silicon electrode is deposited on the SiO$_2$ film to form storage electrodes 57'. A second polycrystalline silicon electrode is deposited on the SiO$_2$ film to form barrier electrodes 58'. The SiO$_2$ film under the storage electrodes 57' is thinner than that under the barrier electrodes 58'. Adjacent storage electrode 57' and barrier electrode 58' are connected with each other to form one shift electrode. Two phase shift pulses $\phi_{H1}$ and $\phi_{H2}$ are applied to the shift electrodes to shift charges from right to left of FIG. 4. The shift pulses $\phi_{H1}$ and $\phi_{H2}$ have a high voltage of 0 volt, a low voltage of $-6$ volts, a pulse width of 35 $\mu$sec. and a repetition interval of 35 $\mu$sec.

The vertical shift registers 46, 47 . . . 48 are coupled to the horizontal shift register 49 though a last electrode 60 formed on SiO$_2$ film on the channel regions 55 with a first polycrystalline silicon. The last electrode 60 is applied with a voltage of $-8$ volts when charges are shifted through the horizontal shift register 49 and with a voltage of 0 volt when charges are shifted through the vertical shift registers 46, 47 . . . 48.

The photo sensors 31, 32 . . . 45 and vertical shift registers 46, 47 . . . 48 are also formed in the P-type well region 54, as shown in FIGS. 5(a) and 5(b). The photo sensors 31, 32 . . . 45 is made of N$^-$-type regions 30 surrounded by the P-type channel stopper region 56 with an except of a part of the periphery of the N$^-$-type regions 30 through which charges accumulated in the N$^-$-type regions 30 are transferred to the vertical shift regions on the channel region 55 of N-type. Through SiO$_2$ film, a first and second polycrystalline silicon layers are deposited to form storage electrodes 57 and barrier electrodes 58, respectively. The vertical shift registers in the left half and right half respectively have common storage and barrier electrodes to receive shift pulses from the shift registers 51 and 52, respectively. The SiO$_2$ film under the storage electrodes 57 is thinner than that under the barrier electrodes 58.

Figure 6:
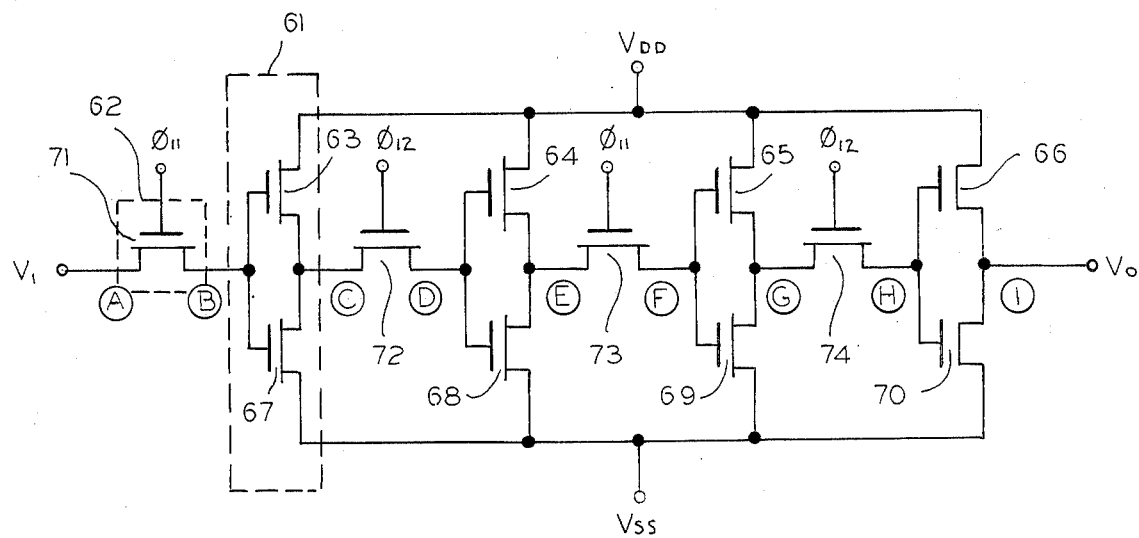
FIG. 6 is a circuit diagram of shift register circuit for producing shift pulses used in the first embodiment.

The shift registers 51 and 52 are cascade connection of a transfer gate 62 and an inverter 61 receiving a signal from the transfer gate 62, as shown in FIG. 6. The circuit diagram of FIG. 6 shows a circuit for producing four shift pulses applied to electrodes of one shift stage of vertical shift registers. In actual use, the circuits of FIG. 6 are connected in cascade with the number of shift stages in one vertical shift register. The shift register of FIG. 6 is powered with power voltages $V_{DD}$ and $V_{SS}$. The power voltage $V_{DD}$ is 0 volt and raised to 10 volts at a part of the vertical blanking period to transfer changes from the photo sensors 31, 32 . . . 45 to the vertical shift registers 46, 47 . . . 48. The other power voltage $V_{SS}$ is held at $-8$ volts.

Figure 7:
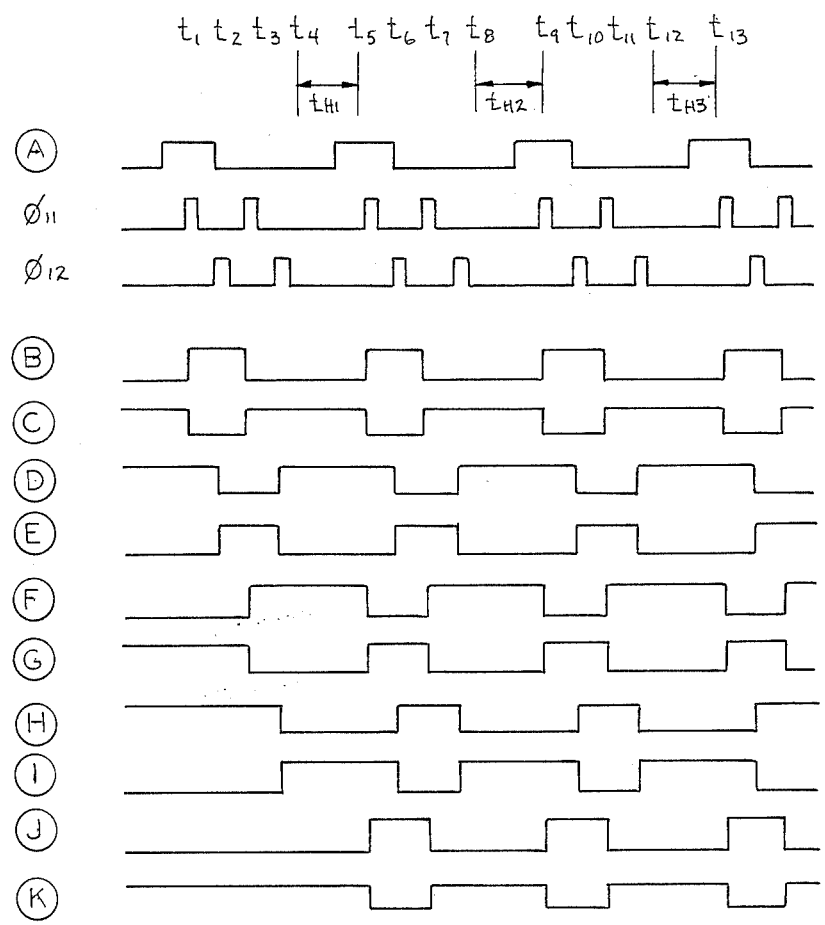
FIG. 7 is a timing chart of clock pulses and shift pulses used in the first embodiment.

The transfer gates 62 are respectively formed of a MOS FET's 71, 72, 73 and 74. Clock pulses $\phi_{11}$ and $\phi_{12}$ shown in FIG. 7 are respectively applied to gates of the MOS FET's 71 and 73 and gates of the MOS FET's 72 and 74. The clock pulses $\phi_{11}$ and $\phi_{12}$ have a high voltage of 0 volt, a low voltage of $-8$ volts and a pulse width of 0.5 to 1.0 $\mu$sec. The inverters 61 are respectively made of P-channel MOS FET's 63, 64, 65 and 66 and N-channel MOS FET's 67, 68, 69 and 70. Gates of P-channel and N-channel MOS FET's are commonly connected to receive signal from the preceeding transfer gate 62. Drains of P-channel and N-channel MOS FET's are also commonly connected to output an inverted signal to the following transfer gate 62.

Input pulses $V_I$ shown in FIG. 7 as a signal Ⓐ is applied to the MOS FET 71. The pulses in the signal Ⓐ have a high-voltage of 0 volt, a low voltage of $-8$ volt, a pulse width of 1 to 5 $\mu$sec. and a repetition interval of about 6.3 $\mu$sec. The input pulses $V_I$ are shifted with the clock pulses $\phi_{11}$ and $\phi_{12}$ through the shift register. During the shift of the input pulses $V_I$, pulses are produced at circuit points Ⓑ to Ⓚ as shown in FIG. 7. The signals at the points Ⓙ to Ⓚ are produced from inverters connected after the circuit point Ⓘ to form following shift stages. The signals at the points Ⓒ, Ⓔ, Ⓖ, Ⓘ and Ⓚ are applied to the vertical shift register 46, 47 . . . 48. The signal at the point Ⓒ is to the storage electrode nearest the horizontal shift register 49. The signal at the point Ⓔ is to the barrier electrode nearest the horizontal shift register 49 which is behind the storage electrode receiving the signal at the point Ⓒ. The signals at the points Ⓖ, Ⓘ and Ⓚ are respectively applied to the next storage electrode, the next barrier electrode and the further next storage electrode. The simbols $t_1$ to $t_{13}$ in FIG. 7 are timing points in horizontal blanking period. The simbols $t_{H1}$ to $t_{H3}$ are effective horizontal field periods.

Figure 8:
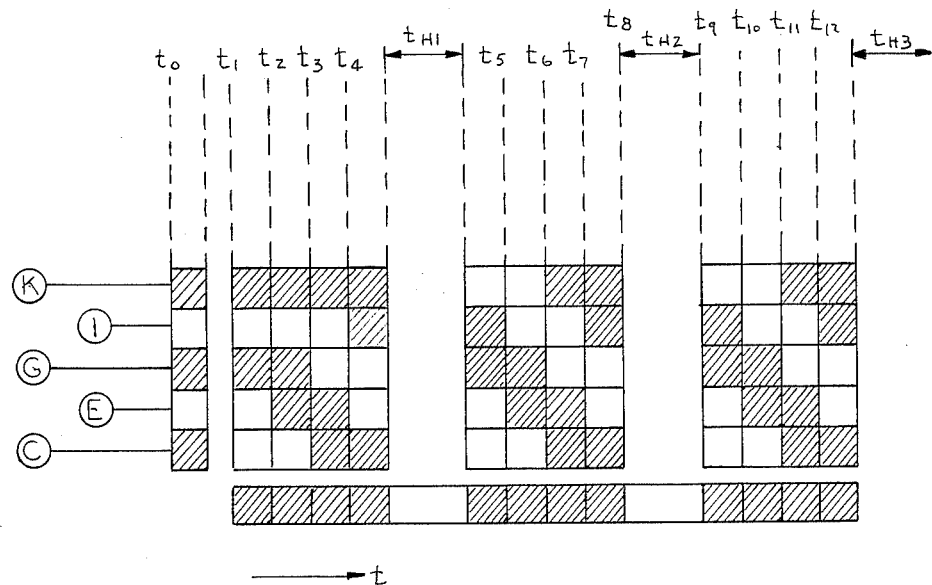
FIG. 8 is a schematic view for explaining the shift of charges in the first embodiment.

The operation of non-interlace scanning will now be explained with mainly referred to FIGS. 7 and 8. First, charges accumulated in all the photo sensors 31, 32 . . . 45 are transferred to the corresponding shift stages of vertical shift registers 46, 47 . . . 48 under the storage electrodes, at a vertical blanking period. This process is not shown in FIG. 7 but in FIG. 8 at a timing $t_0$ and is performed by raising the power voltage $V_{DD}$ of the shift registers 51 and 52 by the power voltage controller 51'' and 52'' to 10 volts. In a horizontal blanking period, an input pulse $V_I$ (hereinafter, referred to as input pulse Ⓐ) is applied the shift registers 51 and 52 from the input pulse generators 51' and 52'. At a timing $t_1$, the MOS FET 71 is closed by the clock pulse $\phi_{11}$ to lower the signal at circuit point Ⓒ (hereinafter, referred as a signal Ⓒ). The charges transferred to the nearest storage electrode of the vertical shift registers 46, 47 . . . 48 are shifted to the horizontal shift register. At a timing $t_2$, the clock pulse $\phi_{12}$ closes the MOS FET 72 to raise the signal at the circuit point Ⓔ (hereinafter, referred as a signal Ⓔ). The charges existing under the storage electrode of the second half of the first shift stage at the timing $t_1$ are expanded under the barrier electrode of the first half of the first shift stage, as shown at the timing $t_2$ in FIG. 8. At a timing $t_3$, the signal at circuit point Ⓖ (hereinafter, referred as a signal Ⓖ) is lowered to exhaust charges from the storage electrode of the second half of the first shift stage. Simultaneously, the signal Ⓒ rises to shift charges to the storage electrode of the first half of the first shift stage, as shown at the timing $t_3$ of FIG. 8. At this timing $t_3$, charges at the storage electrode of the first half of the second shift stage is not moved and are separated from the preceding charges by one storage electrode and one barrier electrode to allow usual shift without mixing with the preceding charges. At a timing $t_4$, the clock pulses $\phi_{12}$ raises signal at the circuit point Ⓘ (hereinafter, referred as a signal Ⓘ) to expand charges to the barrier electrode of the second half of the first shift stage, and lowers the signal Ⓔ to exhaust charges from the barrier electrode of the first half of the first shift stage and to collect charges existing under the storage and barrier electrodes of the first half of the first shift stage at the timings $t_2$ and $t_3$ to a part under the storage electrode only. The charges existing under the storage electrode of the second half of the second shift stage start moving, but the interval from the preceding charges prevent the charges from being mixed with the preceding charges. At an effective horizontal field period $t_{H1}$, charges shifted to the horizontal shift register 49 at the timing $t_1$ are shifted through the horizontal shift register 49 to the charge-voltage converter 50.

At timing $t_5$, a signal at the circuit point K (hereinafter, referred as a signal Ⓚ) the signal Ⓖ respectively lowers and rises to move charges existing under the storage electrode of the first half of the second shift stage and the barrier electrode of the second half of the first shift stage at the timing $t_4$ to under the barrier and storage electrode of the second half of the first shift stage. The signal Ⓒ lowers to shift charges existing under the storage electrode of the first half of the first shift stage at the timing $t_4$ to the horizontal shift register 49. At this timing $t_5$, charges under the storage electrode of the second half of the second shift stage is separated from preceding charges by an interval of one storage electrode and one barrier electrode to allow to be shifted without being mixed with the preceding charges. The charges under the storage electrode of the first half of the second shift stage start shifting at the next timing. After charges are shifted at timings $t_7$ and $t_8$, charges shifted to the horizontal shift register 49 are shifted through the horizontal shift register 49 to the charge-voltage converter 50 at the next effective horizontal field period $t_{H2}$. The above processes are repeated at the timings $t_9$ to $t_{12}$ and the effective horizontal field period $t_{H3}$ and the following timings and the following horizontal scanning periods.

By the above-mentioned driving method, all the charges accumulated in all the photo sensors are derived in series with voltage form signals during one vertical field period. In other words, it is possible to derive an interline transfer type CCD area image sensor with a non-interlace scanning without mixing charges accumulated in adjacent photo sensors.

Figure 9:
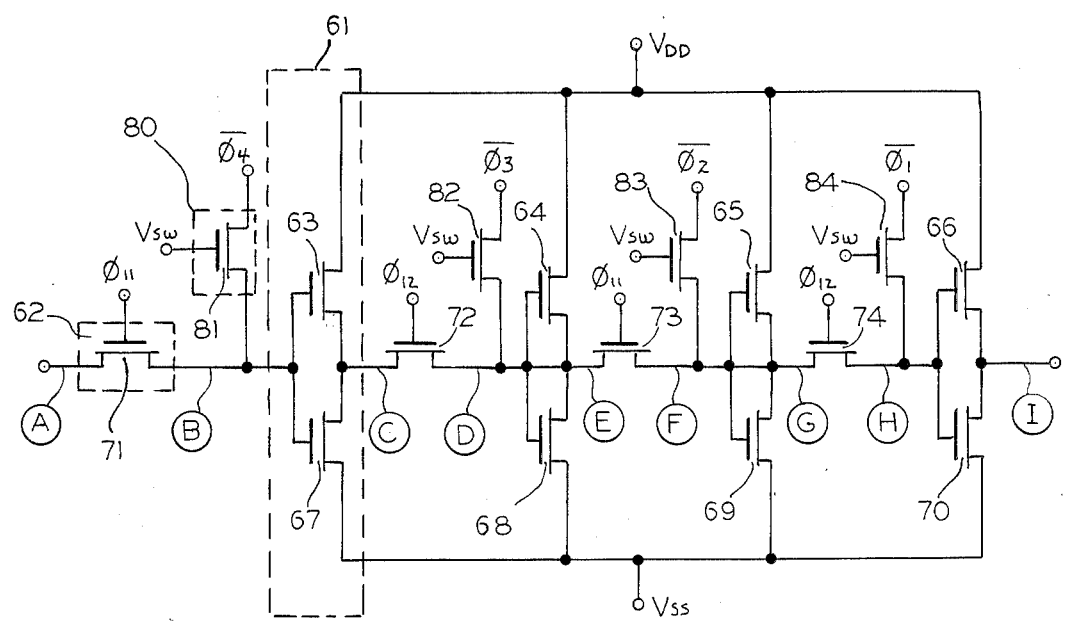
FIG. 9 is a circuit diagram of shift register circuit for producing shift pulses used in a second embodiment according to the present invention.

A second embodiment of the present invention uses an interline transfer type CCD area type sensor similar to that used in the first embodiment explained with reference to FIGS. 3, 4, 5(a), 5(b). The operation in the non-interlace scanning is also similar to that of the first embodiment explained with reference to FIGS. 7 and 8. Only the circuit diagram of the shift registers 51 and 52 producing shift pulses is different from the first embodiment. The circuit diagram of the shift registers 51 and 52 is shown in FIG. 9 and is modified so as to perform an interlace scanning of the interline transfer type CCD area image sensor.

Figure 10:
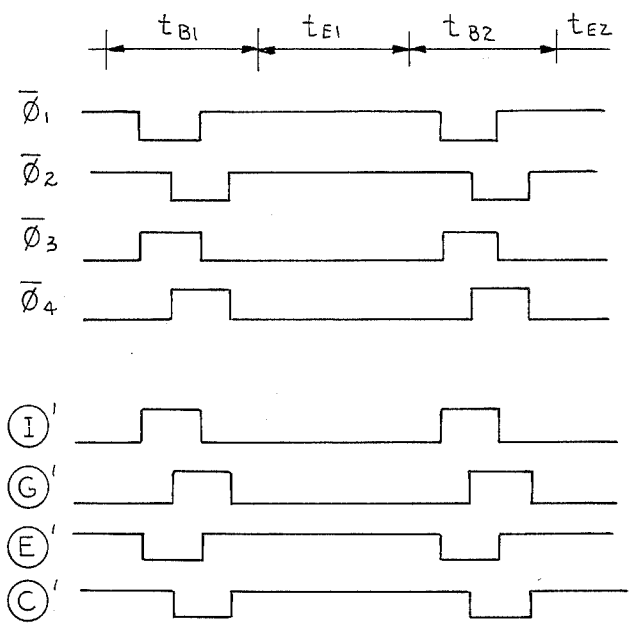
FIG. 10 is a timing chart of shift pulses at interlace scanning produced by the shift register circuit of FIG. 9.

Fundamental construction of the shift register circuit is similar to the first embodiment to enable the non-interlace scanning. A plurality of combinations of a transfer gate 62 formed of one of MOS FET's 71, 72, 73 and 74 and an inverter 61 formed of one of P-channel MOS FET's 63, 64, 65 and 66 and one of N-channel MOS FET's 67, 68, 69 and 70 and receiving signal from the transfer gate 62 are connected in cascade. Switches 80 formed of MOS FET's 81, 82, 83 and 84 are added to the connection points of the transfer gates 62 and the inverters 61. Inverted signal of four phase shift pulses $\bar{\phi}_1$, $\bar{\phi}_2$, $\bar{\phi}_3$ and $\bar{\phi}_4$ shown in FIG. 10 are applied to the connection points through the switches under a control of a switch signal $V_{SW}$ applied to gates of the MOS FET's 81, 82, 83 and 84. In actual case, the combinations of the transfer gate 62, the inverter 61 and the switch are connected in cascade with the number of four times of shift stages in the vertical shift register 46, 47 . . . 48.

At the non-interlace scanning, the switches 80 are opened by lowering the switch signal $V_{SW}$ to some voltages under 0 volt. The functional part of the shift register shown in FIG. 9 becomes similar to FIG. 6 and produces shift pulses at the circuit points Ⓒ, Ⓔ, Ⓖ and Ⓘ as explained with reference to FIGS. 6, 7 and 8. The details of the operation for the non-interlace scanning is omitted to avoid overlapping.

At the interlace scanning, the switches 80 are closed by raising the switch signal $V_{SW}$ to zero or some voltages above zero volt to supply the inverted four phase shift pulses $\bar{\phi}_1$, $\bar{\phi}_2$, $\bar{\phi}_3$ and $\bar{\phi}_4$ shown in FIG. 10 to the inverters 61 at horizontal blanking periods $t_{B1}$, $t_{B2}$ . . . Simultaneously, the transfer gates 62 are opened by fixing the clock pulses at $-8$ volts. The circuit shown in FIG. 9 is transformed from a shift register to a plurality of independent inverters to produce the non-inverted four phase shift pulses shown in FIG. 10 as signals Ⓒ', Ⓔ', Ⓖ' and Ⓘ' at the circuit points Ⓒ, Ⓔ, Ⓖ and Ⓘ of the circuit shown in FIG. 9.

Prior to application of the signals Ⓒ', Ⓔ', Ⓖ' and Ⓘ' to the vertical shift registers 46, 47 . . . 48, the power voltage $V_{DD}$ is raised to 10 volts at a vertical blanking period with an application of a high voltage of the inverted shift pulses $\bar{\phi}_1$ and $\bar{\phi}_2$. The charges accumulated in every other photo sensors 31, 32 . . . 45 are transferred to the vertical shift registers 46, 47 and 48. At the next vertical blanking period, the power voltage $V_{DD}$ is raised to 10 volts with a high voltage of the other inverted shift pulses $\bar{\phi}_3$ and $\bar{\phi}_4$ to transfer charges accumulated in the other photo sensors 31, 32 . . . 45 to the vertical shift registers 46, 47 and 48.

In the vertical scanning period, the signals Ⓒ', Ⓔ', Ⓖ' and Ⓘ' are applied to the vertical shift registers 46, 47 and 48 to shift the transferred charges through the vertical shift registers 46, 47 and 48 to the horizontal shift register 49. Since charges exist under one electrode among four electrodes of one shift stage, the charges are shifted in the conventional way of four phase pulse drive without being mixed with adjacent charges.

In this way, the second embodiment explained with reference to FIGS. 9 and 10 can change the driving method of an interlace transfer type CCD area image sensor between an interlace scanning and a non-interlace scanning by changing the switch signal $V_{SW}$ and the clock pulses $\phi_{11}$ and $\phi_{12}$. This change can be easily performed with a small addition of circuit elements to the shift registers 51 and 52. This change is convenient for selectively taking TV pictures with a current interlace scanning or TV pictures of high resolution with a non-interlace scanning.

Although some embodiment of the present invention has been described in the foregoing, the present invention is not limited to the above explained embodiments. Only one shift registers for producing shift pulses may be used in place of two shift registers 51 and 52 of FIG. 3. The CCD used in the vertical shift registers 46, 47 . . . 48 and the horizontal shift register 49 may be made of a surface channel type instead of the buried channel type used in the above embodiments. The photo sensors 31, 32 . . . 45 may be changed to MOS type from the PN-diode type used in the above embodiments.

What is claimed is:

1. A method for driving a CCD area image sensor including a plurality of photo sensors arranged in a plurality of lines, a plurality of vertical shift registers each disposed along one line of said photo sensors, said vertical shift register having a series of plural number of shift stages, each two of said photo sensors being disposed so as to face one of said shift stages, a horizontal shift register formed to receive charges from said vertical shift registers, an output means for converting charges transferred through said horizontal shift register into electrical signals, and a transferring means for transferring charges accumulated in said photo sensors to said vertical shift registers, the method for driving said CCD area image sensor comprising the steps of:

exposing said photo sensors to an object to be sensed to accumulate charges in said photo sensors;

transferring said charges accumulated in all of said photo sensors to said vertical shift registers;

shifting said transferred charges through said vertical shift registers toward said horizontal shift register, the shift through said vertical shift registers being initiated from charges transferred to said vertical shift register at the shift stage nearest to said horizontal shift register to charges transferred to said vertical shift register at the shift stage farthest from said horizontal shift register in order of distance from said horizontal shift register;

shifting charges shifted to said horizontal shift register therethrough toward said output means; and converting a quantity of charges shifted to said output means to an electrical signal by said output means.

2. A method for driving a CCD area image sensor as claimed in claim 1, wherein said charges transferred to said vertical shift registers are started shifting through said vertical shift registers after the interval between adjacent charges in said vertical shift register is expanded by shifting said adjacent charges.

3. A method for driving a CCD area image sensor as claimed in claim 1, wherein said charges transferred to said vertical shift register are started shifting said vertical shift registers after adjacent charges in said vertical shift register are shifted to the direction to said horizontal shift register to separate from said charges to be started shifting with a distance corresponding to a half of said shift stage of said vertical shift registers.

4. A method for driving a CCD area image sensor as claimed in claim 1, wherein each of said shift stages of said vertical shift registers has two halves, each having a storage electrode and a barrier electrode, each of said photo sensors being disposed to correspond one of said storage electrodes, and charges accumulated in all the photo sensors being simultaneously transferred to parts under every storage electrode of said vertical shift register.

5. A method for driving a CCD area image sensor as claimed in claim 4, wherein charges transferred to said vertical shift registers are started shifting after charges in a preceding stage in said vertical shift register are shifted to empty toward said horizontal shift register to vacate charges from said parts under adjacent barrier and storage electrodes.

6. A CCD area image sensor comprising;

a plurality of photo sensors arranged in a plurality of lines and accumulating charges in response to incident light;

a plurality of vertical shift registers disposed in parallel with one of said lines of said photo sensors, respectively, a transfer means for transferring charges accumulated in said photo sensors to said vertical shift registers, a horizontal shift register disposed at one end of said vertical shift registers and having a plurality of shift electrodes;

a charge-voltage converter converting charges received from said horizontal shift register to a voltage form signal;

a first driving means for driving said vertical shift registers to shift charges transferred to said vertical shift registers to said horizontal shift register, said first driving means including means for delaying successively input pulses applied thereto to produce a plurality of successively delayed pulses and means for applying said successively delayed pulses to said shift electrodes of said vertical shift registers; and a second driving means for driving said horizontal shift register to shift charges in said horizontal shift register to said charge-voltage converter.

7. A CCD area image sensor as claimed in claim 6, wherein said delaying means includes a cascade connection of a plurality of combinations of a transfer gate and an inverter receiving a signal from said transfer gate, said delayed pulses being produced at output nodes of said inverters.

8. A CCD area image sensor as claimed in claim 6, wherein said vertical shift registers include a plurality of shift stages continuously disposed, said shift stages being made of two halves one of said two halves having a storage electrode, the other of said two halves having a barrier electrode and pairs of said storage and barrier electrodes forming shift electrodes, and each of said photo sensors being disposed to correspond to each of said storage electrodes.

9. A CCD area image sensor as claimed in claim 7, wherein said delayed pulses derived from said output nodes of said inverters are applied to said shift electrodes so that the number of said inverters from an input node receiving said input pulses of said delaying means corresponds to the number of shift electrodes counted from said horizontal shift register.

10. A CCD area image sensor as claimed in claim 9, wherein said shift register further includes switches applying four phase shift pulses to said inverters as input signals under a control of a switching signal when said transfer gates are opened.

11. A CCD area image sensor as claimed in claim 10, wherein said switches are respectively made of a MOS field effect transistor having an electrical path between a source and a drain and a gate, one terminal of said electrical path receiving one of said four phase shift pulses, the other terminal of said electrical path supplying said one of said four phase shift pulses to one of said inverters and said gate receiving said switching signal.

* * * * *